(12) United States Patent
Maier

(10) Patent No.: US 8,695,797 B2
(45) Date of Patent: Apr. 15, 2014

(54) PLASTIC HOUSING FOR ELECTRONIC DEVICES, IN PARTICULAR FOR REMOTE CONTROLS

(75) Inventor: Ferdinand Maier, Obertrum am See (AT)

(73) Assignee: FM Marketing GmbH (AT)

( * ) Notice: Subject to any disclaimer, the term of this patent is extended or adjusted under 35 U.S.C. 154(b) by 0 days.

(21) Appl. No.: 13/520,424

(22) PCT Filed: Sep. 15, 2011

(86) PCT No.: PCT/EP2011/004628
§ 371 (c)(1),
(2), (4) Date: Jul. 3, 2012

(87) PCT Pub. No.: WO2012/038047
PCT Pub. Date: Mar. 29, 2012

(65) Prior Publication Data
US 2013/0229095 A1    Sep. 5, 2013

(30) Foreign Application Priority Data
Sep. 21, 2010   (DE) ..................... 10 2010 045 944 A

(51) Int. Cl.
*B65D 85/00*   (2006.01)
(52) U.S. Cl.
USPC ....... 206/320; 312/223.1; 220/4.02; 220/4.21
(58) Field of Classification Search
USPC ......... 206/37, 320, 305, 387.1; 174/561, 563, 174/562, 560, 559, 520, 50, 541, 613; 220/4.02, 4.21, 783, 797; 312/223.1–223.5
See application file for complete search history.

(56) References Cited

U.S. PATENT DOCUMENTS

| 4,006,764 A |   | 2/1977 | Yamamoto et al. |
| 5,140,108 A | * | 8/1992 | Miyajima ..................... 174/563 |
| 5,199,593 A | * | 4/1993 | Kita ............................ 220/613 |
| 5,288,350 A | * | 2/1994 | Kita ............................ 156/73.1 |

(Continued)

FOREIGN PATENT DOCUMENTS

| DE | 7411492 | 7/1974 |
| DE | 4340198 | 6/1995 |

(Continued)

OTHER PUBLICATIONS

Abstract of DE4340198; Jun. 1, 1995.

(Continued)

*Primary Examiner* — Andrew Perreault
(74) *Attorney, Agent, or Firm* — Senniger Powers LLP

(57) ABSTRACT

The plastic housing connects two housing parts with only a plurality of pins on one of the housing parts and a plurality of the sleeves correlated with the pins with boreholes. The diameters of the pins are at the same time larger than the diameters of the boreholes. Furthermore, the distances between the adjacent pins and the distances between the boreholes correlated with the pins are unequal by such an extent that the pins can be inserted in the correlated boreholes, but the pins and the boreholes are braced against one another as the result of the unequal distances in a connecting plane. In this way, a simple and secure connection is created between the housing parts and the flexural and torsional rigidities of the entire housing are improved.

22 Claims, 3 Drawing Sheets

(56) References Cited

U.S. PATENT DOCUMENTS 5,310,075 A * 5/1994 Wyler .......................... 220/4.02
5,493,787 A * 2/1996 Owens ............................ 33/414
5,875,918 A * 3/1999 Sheffler et al. ................ 220/783
8,052,001 B2 * 11/2011 Chen et al. .................. 220/4.02

FOREIGN PATENT DOCUMENTS

| EP | 0881867 | A2 | 12/1998 |
| EP | 1553610 | A2 | 7/2005 |
| EP | 1843367 | A2 | 10/2007 |

OTHER PUBLICATIONS

International Preliminary Report on Patentability, PCT/EP2011/004628, dated Mar. 26, 2013, 7 pages.
International Search Report, PCT/EP2011/004628, dated Jan. 19, 2012, 3 pages.
Written Opinion, PCT/EP2011/004628, dated Jan. 19, 2012, 5 pages.

* cited by examiner

PLASTIC HOUSING FOR ELECTRONIC DEVICES, IN PARTICULAR FOR REMOTE CONTROLS

FIELD OF THE INVENTION

The invention refers to a plastic housing for electronic devices, in particular for remote controls, of the type having housing parts connected by pins, sleeves, and boreholes.

BACKGROUND

Such housings are generally known and can be obtained on the market. The housings consist of a first and a second housing part, which can be designated also as an upper tray and a lower tray and have identical edges, which, when assembled, are in contact with one another. The assembled housing forms a cavity in which electrical and electronic components can be arranged. For the alignment and centering of the upper and lower trays, pins are provided on one of the housing parts and boreholes, correlated with the pins, on the other housing part. For a secure fastening of the two housing parts, additional locking hooks or screws are usually used. Also, it is usual to cement or to weld with one another, the two housing parts on their edges.

These types of linkages, such as the use of locking hooks, screwing, cementing, or welding, are material-consuming or labor-intensive. Moreover, the most frequently used locking hooks have the disadvantage that a meshing of the locking hooks requires a certain clearance, with the result that the two housing parts are not connected firmly with one another, which leads to a reduced flexural and torsional rigidity of the housing. In addition, connections with locking hooks can no longer be detached in a nondestructive manner unless the housing has dismantling openings in the area of the locking hooks, so as to move the locking hooks from their locking position. With cemented or welded housing parts, a dismantling is not possible at all without destruction. With screwing, dismantling is possible. However, a stable connection of two housing parts with screwings is attained only if one uses a large number of screws. Usually, however, only four to a maximum of six screws are used, so that the flexural and torsional rigidity of the assembled housing is not satisfactory.

SUMMARY OF THE INVENTION

The goal of the invention, therefore, is to improve the plastic housing of the type mentioned in the beginning to the effect that with reduced material consumption and labor in the assembly, a stable housing with, in particular, flexural and torsional rigidity is created, which can be assembled in a particularly simple manner and can be opened without destruction.

This goal is attained by the features indicated in Patent Clam 1. Briefly, therefore, the invention is directed to a plastic housing for electronic devices comprising a first housing part and a second housing part, which are connected with one another by means of a plurality of pins having diameters on one of the housing parts and a plurality of sleeves correlated with the pins with boreholes having diameters on the other housing part, wherein the diameters of the pins are larger than the diameters of the boreholes corresponding to the pins, wherein distances between adjacent pins and distances between adjacent boreholes correlated with the pins are unequal to such an extent that the pins can be inserted into the correlated boreholes, but the pins and the boreholes are elastically braced against one another because of the unequal distances.

Advantageous developments and refinements of the invention can be deduced from the subordinate claims.

The basic idea of the invention is to be found in the bringing about of a connection only with pins and correlated boreholes, which produces a bracing between the pins and boreholes as a result of special dimensioning. To this end, the diameters of the pins, on the one hand, are made larger than the diameters of the correlated boreholes—preferably, by approximately 0.7% to 1%. Furthermore, the distances between the pins relative to one another, and the distances between the boreholes correlated with the pins and relative to one another, are unequal to such an extent that the pins can be inserted into the correlated boreholes, but they are elastically under tension with respect to one another because of the unequal intervals. The prerequisite, of course, is for the pins and boreholes to be made of elastic material, which is the case with a plastic housing because of the material characteristics.

According to one preferred embodiment, the distances between the adjacent pins and the distances between the correlated, adjacent boreholes differ by approximately 0.7% to 1% of the diameter of the pins.

According to another development of the invention, the pins and the boreholes are arranged in straight lines close to the edges of the housing parts. It is advantageous thereby if the distances between the adjacent pins are unequal from one another along one row. The distance between the pins and the edge of the housing part is advantageously on the order of magnitude of one pin diameter.

The pins and the boreholes are advantageously connected as one piece with the individual housing part, preferably by means of reinforcing ribs. Both housing parts can therefore be injection-molded as one piece made of plastic. Preferred plastics are ABS (acrylonitrile-butadiene-styrene) or polycarbonate.

BRIEF DESCRIPTION OF THE DRAWINGS

The invention is explained in more detail below in connection with the drawing. The figures show the following.

DETAILED DESCRIPTION OF PREFERRED EMBODIMENTS

Figure 1:
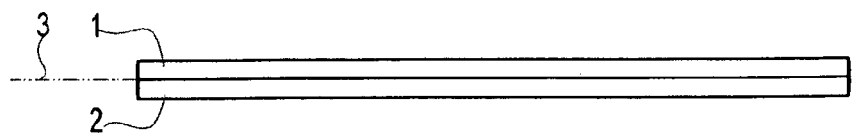
FIG. 1, a side view of a plastic housing according to the invention.

FIG. 1 shows a side view of a plastic housing with a first housing part 1 and a second housing part 2, which are connected with one another in a connecting plane 3.

Figure 2:
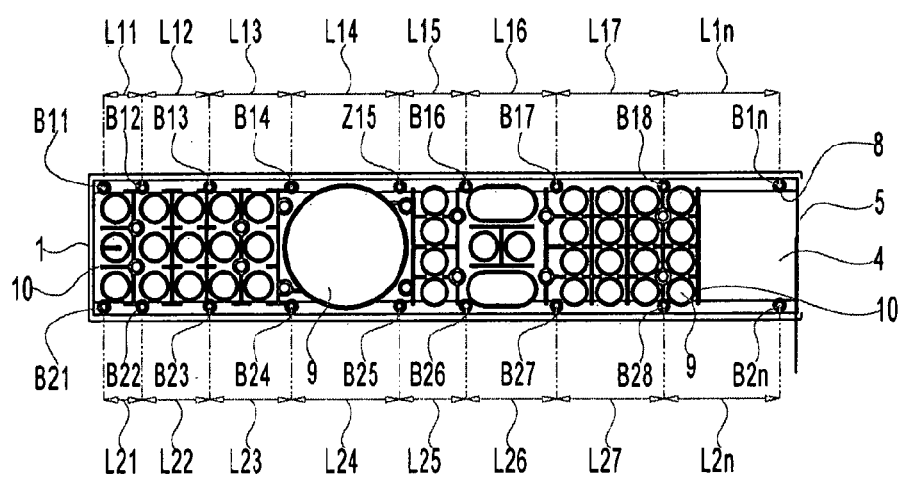
FIG. 2, a view of the interior of a first housing part.

FIG. 2 shows a view of the interior of a first housing part 1 on the embodiment example of a plastic housing for a remote control. The first housing part 1 has an essentially planar bottom 4, of which a circumferential edge 5 stands out in an essentially vertical manner and its end surface 6 is in the connecting plane 3 when the plastic housing has been assembled. In the end surface 6, an indentation 7 is formed, which, for example, can be semi-circular.

Close to the surrounding edge 5, several sleeves 8 are formed in one piece with the housing part 1, which sleeves respectively have a borehole B11-B1n and B21-B2n. The boreholes B11-B1n are arranged in a straight row close to a longitudinal side of the surrounding edge 5, whereas the boreholes B21-B2n are arranged close to the opposite longitudinal side of the surrounding edge 5. In the represented embodiment example, the boreholes B11-B1n are in a mirror image arrangement relative to the boreholes B21-B2n. The middle axes of the individual boreholes have a distance relative to the adjacent borehole of L11-L1n and L21-L2n. The distances L11 and L21, L12, and L22-L1n and L2n are equal, whereas the distances L11, L12 . . . to L1n can be unequal. Thus, for example, the distances L11 and L21 are equal but the distances L11 and L12 are unequal. Something analogous is true for the distances L21-L22 and so forth.

The first housing part 1 has a plurality of openings 9 in the bottom 4, through which operating keys, which are not depicted, protrude. Furthermore, the first housing part has a plurality of reinforcement ribs 10, which stand out vertically from the bottom 4, so as to give the housing part 1 a desired rigidity in spite of the many openings 9.

The second housing part 2 also has an essentially planar bottom 14 and a circumferential edge 15, which stands out vertically from the bottom 14 and whose end surface 16 is in the connecting plane 3 when the plastic housing has been assembled and which comes into contact with the end surface 6 of the first housing part. Corresponding to the indentation 7 of the first housing part 1, the second housing part 2 has a projection 17 adapted to it, which is also semi-circular in this case. Also, the second housing part 2 can have several reinforcement ribs 20. The bottom 14 can also have an opening 19 as access to a battery compartment.

Corresponding to the sleeves 8 with the boreholes B, the second housing part 2 has a plurality of pins Z21-Z2n and Z11-Z1n. The pins Z21-Z2n are correlated with the boreholes B21-B2n and the pins Z11-Z1n to the boreholes B11-B1n.

The distances between the adjacent pins Z relative to one another are designated with L31-L3n and L41-L4n. The middle axes of the pins Z21-Z2n and those of the pins Z11-Z1n are also arranged in straight lines close to the surrounding edge 15, and are at a short distance to it, which is on the order of magnitude of the diameter of the pins. The bottom ends of the pins Z facing the bottom 14 are connected to the surrounding edge 15 or the bottom 14 as one piece via reinforcement ribs 21.

In order to be able to firmly connect the two housing parts 1 and 2 only via the pins Z and the boreholes B, the following measures are provided, which are explained in connection with FIGS. 4 and 5. The pins Z depicted there are cylindrical and have a diameter D1. The correlated boreholes B in the sleeves 8 are also cylindrical and have a diameter D2. It is important for the invention that the diameter D1 of the pins Z be larger than the diameter D2 of the boreholes B by approximately 0.7% to 1% of the diameter D1 of the pins Z. Since the pins Z are placed as one piece on the second housing part 2 and therefore are also made of plastic, they are elastic because of the material characteristics of the plastic. For the same reason, the sleeves 8 are also elastic, so that the pins Z can be introduced into the boreholes B in spite of the larger diameter D1, wherein a frictional locking connection is already produced with reference to forces in the direction of the middle axis of the pins Z and the boreholes B and a form-locking connection with reference to forces in the connecting plane 3.

In a concrete embodiment example, the diameter of the pins is 2.52 mm, whereas the diameter of the boreholes is 2.50 mm.

In order to guarantee the introduction of the pins Z into the boreholes B, the pins Z have a bevel 22 on their free end. In addition, the boreholes B have a widening 23 on their free end. In this way, the pins Z can then be introduced into the borehole B even if their mutual middle axes are not exactly aligned.

For the further improvement of the connection between the pins Z and the boreholes B and thus also for the further reinforcement of the two housing parts 1 and 2, the invention provides for the distances between the adjacent pins and the distances between the adjacent boreholes correlated with the pins to be unequal—to such an extent that the pins can be inserted into the correlated boreholes, but the pins and boreholes are braced elastically against one another because of unequal distances. This is explained in more detail with the example of the pins Z11 and Z12 and the correlated boreholes B11 and B12 with reference to FIG. 5. The distance between the adjacent pins Z11 and Z12 is L41. The distance between the adjacent boreholes B11 and B12 is L11. These distances refer in each case to the middle axes of the boreholes and pins. These distances L11 and L41 are not identical in accordance with an important feature of the invention, but rather are offset by V relative to one another, which is depicted in FIG. 5. In this example, the distance L41 between the two adjacent pins Z11 and Z12 is smaller by the amount V than the distance L11 between the adjacent boreholes B11 and B12. If the pins Z11 and Z12 are now introduced into the boreholes B11 and B12, then longitudinal forces appear in the direction of the arrow X, which elastically deform the pins, the sleeves, and, via the reinforcement ribs, also the edges 5, 15 and the bottoms 4, 14 of the two housing parts 1 and 2 and brace the pin/sleeve connections in the connecting plane 3, which is parallel to the X direction depicted in FIG. 5.

By means of this bracing, on the one hand, an additional frictional force is applied between the pins and correlated boreholes, in the sense of an adhesive friction against a movement in the Z direction, that is, parallel to the middle axes of the pins and boreholes, which impedes an (unintended) loosening of the connections. On the other hand, however, also by means of this bracing, the flexural rigidity and the torsional rigidity of the two housing parts are substantially increased.

Figure 3:
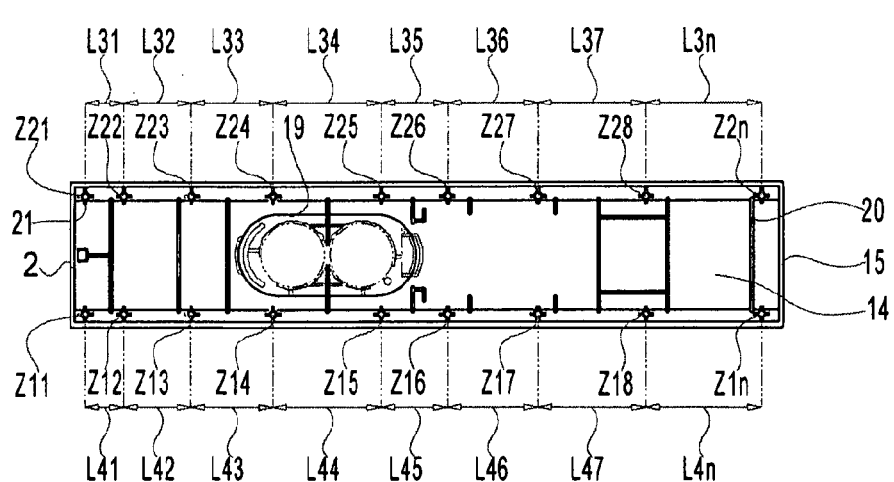
FIG. 3, a view of the interior of a second housing part.
Figure 4:
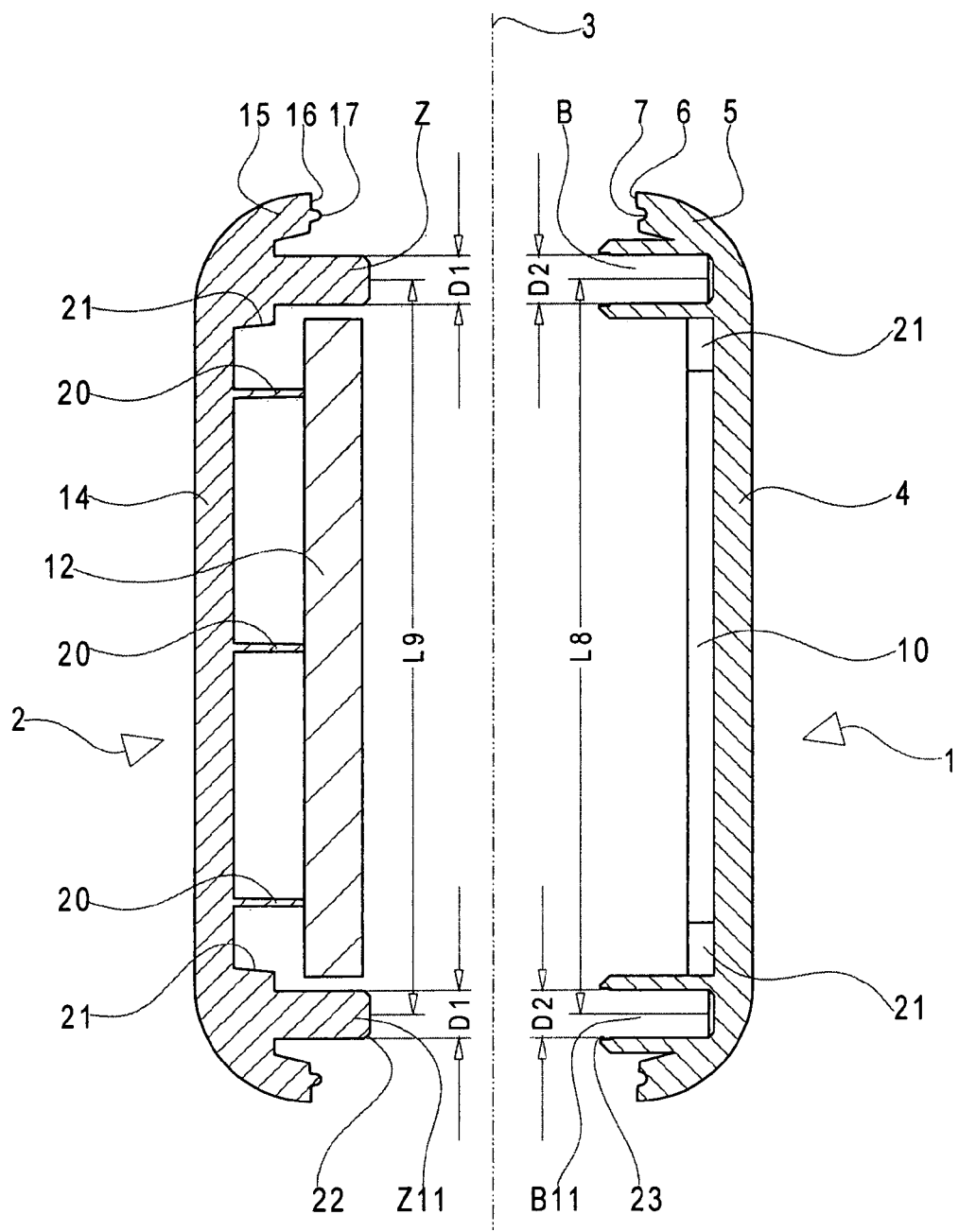
FIG. 4, an enlarged sectional view as a blow-up representation of the two housing parts of FIGS. 2 and 3.
Figure 5:
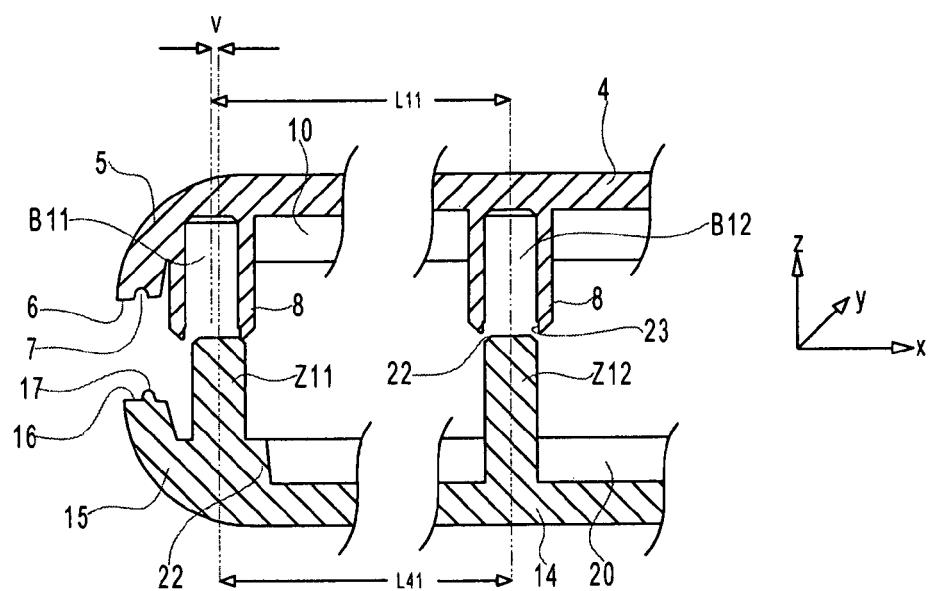
FIG. 5, an enlarged sectional view of housing parts with pins and boreholes.

This bracing principle can also be attained alternatively or cumulatively in that the distances L8 and L9 depicted in FIG. 4 are unequal. For example, the distance between the middle axes of the boreholes B11 and B21 (FIG. 2) and the distance between the pins Z11 and Z21 (FIG. 3) are thus unequal, so that a bracing also takes place in the Y direction (FIG. 5).

The magnitude of the offset V (FIG. 5) is to be coordinated with the material characteristics of the plastic used, so that an excess stress of the material and, in particular, a breaking of the pins or the sleeves is avoided. Also the bevels 22 on the pins and the widenings 23 on the boreholes are to be coordinated with the offset V, so that with the maximum possible offset, the bevels 22 still come into contact with the edges of the widenings 23 and the pins can thus be introduced.

If the two housing parts 1 and 2 are completely connected with one another, then the projection 17 on the surrounding edge 15 meshes into the indentation 7 on the surrounding edge 5 and the two end surfaces 6 and 16 are close to one another without a gap. The meshing of the projection 17 into the indentation 7 additionally forms a form-locking connection of the two surrounding edges in the X-Y plane, that is, of the connecting plane 3, and provides a further reinforcement of the plastic housing. In addition, the meshing of the projection 17 into the indentation 7 also acts as a sealing against the penetration of dirt and dust.

The so-called offset V is 0.7-1% of the diameter D1 of the pins Z in a preferred embodiment example of the invention. If the offset is undertaken in the x and y directions, then it is to be determined as an offset with x and y components.

It is preferable, however, to provide the offset only in the X direction, that is, the longitudinal direction of the housing, if the housing is elongated as depicted in FIGS. 1-3, that is, has a greater length than width, since the flexural rigidity with reference to the longitudinal extension is more important than with reference to the transverse extension.

In the manufacturing of injection-molding tools for the two housing parts 1 and 2, one should take care that the two housing parts 1 and 2 can exhibit a different shrinkage behavior because of the different shaping of the openings 9 and the reinforcement ribs 10, 20, 22 during the curing of the plastic. Also, different plastics have different shrinkage behaviors. With ABS, the degree of shrinkage is approximately 0.5%; with polycarbonate, on the other hand, 0.65-0.70%. The wall thickness of the reinforcement ribs 10, 20, 22 also plays a role. Preferably, the reinforcement ribs 10, 20, 22 have a wall thickness of ⅔ of the wall thickness of the bottoms 4 and 14. If the bottoms 4 and 14 have a wall thickness of 2 mm, then one gives the ribs a wall thickness of a maximum 1.33 mm. Preferably, the reinforcement ribs have a draft. On the lower end, they preferably have a wall thickness of 1.2 mm and on the free end, 0.8 mm.

In summary, the invention creates a dimensionally stable plastic housing, which can be assembled in an extremely simple manner and which can be opened only very difficultly but, nevertheless, free of destruction.

The invention claimed is:

1. A plastic housing for electronic devices, in particular, for remote controls, comprising:
    a first housing part and a second housing part, which are connected with one another by means of a plurality of pins having diameters on one of the housing parts and a plurality of sleeves correlated with the pins with boreholes having diameters on the other housing part,
    wherein the diameters of the pins are larger than the diameters of the boreholes corresponding to the pins,
    wherein distances between middle axes of adjacent pins and distances between middle axes of adjacent boreholes correlated with the pins are unequal to such an extent that the pins can be inserted into the correlated boreholes, but the pins and the boreholes are elastically braced against one another because of the unequal distances.

2. The plastic housing according to claim 1, wherein the diameters of the pins are larger by 0.7% to 1% than the diameters of the boreholes.

3. The plastic housing according to claim 2, wherein the diameters of the pins are 2.52 mm and the diameters of the boreholes are 2.50 mm.

4. The plastic housing according to claim 1, wherein the distances between the adjacent pins and the distances between the correlated adjacent boreholes differ from one another by 0.7-1.0% of the pin diameter.

5. The plastic housing according to claim 2, wherein the distances between the adjacent pins and the distances between the correlated adjacent boreholes differ from one another by 0.7-1.0% of the pin diameter.

6. The plastic housing according to claim 3, wherein the distances between the adjacent pins and the distances between the correlated adjacent boreholes differ from one another by 0.7-1.0% of the pin diameter.

7. The plastic housing according to claim 1, wherein the pins and the boreholes are arranged in rows parallel to edges of the housing parts.

8. The plastic housing according to claim 2, wherein the pins and the boreholes are arranged in rows parallel to edges of the housing parts.

9. The plastic housing according to claim 3, wherein the pins and the boreholes are arranged in rows parallel to edges of the housing parts.

10. The plastic housing according to claim 4, wherein the distances between pins opposite one another and the boreholes opposite one another are unequal.

11. The plastic housing according to claim 1, wherein the distance between the pins and an inward edge of a surrounding edge is, as a maximum, the diameter of the pins.

12. The plastic housing according to claim 2, wherein the distance between the pins and an inward edge of a surrounding is, as a maximum, the diameter of the pins.

13. The plastic housing according to claim 3, wherein the distance between the pins and an inward edge of a surrounding edge is, as a maximum, the diameter of the pins.

14. The plastic housing according to claim 4, wherein the distance between the pins and an inward edge of a surrounding edge is, as a maximum, the diameter of the pins.

15. The plastic housing according to claim 1, wherein the pins and the sleeves with boreholes are formed integrally on the housing parts and are supported via reinforcement ribs on the bottom and/or the surrounding edge, which ribs stand out vertically from a bottom of the housing parts.

16. The plastic housing according to claim 2, wherein the pins and the sleeves with boreholes are formed integrally on the housing parts and are supported via reinforcement ribs on the bottom and/or the surrounding edge, which ribs stand out vertically from a bottom of the housing parts.

17. The plastic housing according to claim 3, wherein the pins and the sleeves with boreholes are formed integrally on the housing parts and are supported via reinforcement ribs on the bottom and/or the surrounding edge, which ribs stand out vertically from a bottom of the housing parts.

18. The plastic housing according to claim 4, wherein the pins and the sleeves with boreholes are formed integrally on the housing parts and are supported via reinforcement ribs on the bottom and/or the surrounding edge, which ribs stand out vertically from a bottom of the housing parts.

19. The plastic housing according to claim 5, wherein the pins and the sleeves with boreholes are formed integrally on the housing parts and are supported via reinforcement ribs on the bottom and/or the surrounding edge, which ribs stand out vertically from a bottom of the housing parts.

20. The plastic housing according to claim 6, wherein the pins and the sleeves with boreholes are formed integrally on the housing parts and are supported via reinforcement ribs on the bottom and/or the surrounding edge, which ribs stand out vertically from a bottom of the housing parts.

21. The plastic housing according to claim 1, wherein:
    the diameters of the pins are larger by 0.7% to 1% than the diameters of the boreholes;
    the distances between the adjacent pins and the distances between the correlated adjacent boreholes differ from one another by 0.7-1.0% of the pin diameter;
    the pins and the boreholes are arranged in rows parallel to edges of the housing parts;
    the distances between pins opposite one another and the boreholes opposite one another are unequal; and
    the distance between the pins and an inward edge of a surrounding edge is, as a maximum, the diameter of the pins.

22. The plastic housing according to claim 21, wherein the pins and the sleeves with boreholes are formed integrally on the housing parts and are supported via reinforcement ribs on the bottom and/or the surrounding edge, which ribs stand out vertically from a bottom of the housing parts.

* * * * *